United States Patent [19]

Saiki et al.

[11] Patent Number: 4,930,596

[45] Date of Patent: Jun. 5, 1990

[54] LOUDSPEAKER SYSTEM

[75] Inventors: Syuji Saiki, Hirakata; Kazue Sato, Neyagawa; Kazuki Honda, Katano, all of Japan

[73] Assignee: Matsushita Electric Industrial Co., Ltd., Osaka, Japan

[21] Appl. No.: 204,523

[22] Filed: Jun. 9, 1988

[30] Foreign Application Priority Data

| | | | |
|---|---|---|---|
| Jun. 16, 1987 | [JP] | Japan | 62-149647 |
| Jul. 16, 1987 | [JP] | Japan | 62-177427 |
| Oct. 1, 1987 | [JP] | Japan | 62-248718 |
| Mar. 22, 1988 | [JP] | Japan | 63-68563 |

[51] Int. Cl.[4] .......................... G10K 11/10; H05K 5/00

[52] U.S. Cl. .................................... 181/152; 181/156; 181/159; 181/163; 181/185; 181/187; 181/192; 381/99; 381/154; 381/156; 381/158

[58] Field of Search ............... 181/152, 156, 159, 163, 181/181, 185–187, 192, 196; 381/90, 98, 99, 154, 156, 158

[56] References Cited

U.S. PATENT DOCUMENTS

| | | | |
|---|---|---|---|
| 1,965,405 | 7/1934 | Blattner | 181/144 |
| 2,866,513 | 12/1958 | White | 181/156 |
| 3,122,215 | 2/1964 | Sutton | 181/160 |
| 3,923,124 | 12/1975 | Hancock | 181/156 |
| 3,944,757 | 3/1976 | Tsukamoto | 181/152 X |
| 4,301,332 | 11/1981 | Dusanek | 381/159 X |
| 4,524,846 | 6/1985 | Whitby | 181/152 |

*Primary Examiner*—Benjamin R. Fuller

*Attorney, Agent, or Firm*—Wenderoth, Lind & Ponack

[57] ABSTRACT

A loudspeaker system which comprises a loudspeaker unit for radiating a first sound, a horn unit having a throat coupled to the back of the loudspeaker for radiating a second sound, and an acoustic filter provided in the horn for causing an acoustic impedance of the horn unit to be discontinuous. When the minimum frequency of cyclic dales of the sound pressure observed in the characteristic curves of a sound pressure of a composite of the first and second sounds as a result of a phase delay brought about by the length of the horn unit is expressed by fd, a primary harmonic resonance can be produced between the loudspeaker unit and the acoustic filter which is similar to that produced by a straight acoustic tube having its opposite ends closed, thereby to render the frequency of the primary resonance to be generally equal to the frequency fd.

12 Claims, 3 Drawing Sheets

LOUDSPEAKER SYSTEM

BACKGROUND OF THE INVENTION

1. Field of the Invention

The present invention relates to a loudspeaker system of a type having a horn behind a loudspeaker unit.

2. Description of the Prior Art

As one example of loudspeaker systems capable of enhancing sounds within a low frequency region, there is well known a loudspeaker system of the back-loaded horn type. This prior art loudspeaker system of the back-loaded horn type comprises a loudspeaker unit having a horn disposed behind the loudspeaker unit and has a cavity defined in the connection between the loudspeaker unit and the throat of the horn. At the low frequency region, the mechanical reactance presented by the cavity, that is, the acoustic volume, is high as compared with the mechanical impedance of the throat of the horn and acoustic sounds behind the loudspeaker unit are coupled directly with the horn. With an increase in the frequency, the mechanical reactance of the acoustic volume lowers to a value smaller than the mechanical impedance of the throat of the horn. Accordingly, the acoustic sounds emanating from the horn attenuate and a relatively large portion of the acoustic output emanates from the front of the loudspeaker unit.

As discussed above, when the horn is coupled with the rear of the loudspeaker unit through the cavity such as in the prior art loudspeaker system, the acoustic radiation efficiency at the low frequency region can be improved by the presence of the horn. As is well known to those skilled in the art, in order to maximize the effect of the horn, for a given flaring constant at which the horn is flared, the opening (mouth) of the horn must be increased. (See "Elements of Acoustical Engineering" by Harry F. Olson, 1940, D. Van Nostrand Co., Inc., p.p. 106 to 109.) The increase of the mouth causes the horn to be bulky and, therefore, in a relatively small-size loudspeaker system, it has been a frequent practice to use a horn having a shape generally similar to a straight tube, that is, a generally straight horn. In such a generally straight horn, the flaring constant is small and the resonance tends to occur at a frequency which is determined by the overall length thereof.

The resonance frequency $f_n$ is expressed by the following equation.

$$f_n=(C/4L)\times(2n+1)(n=0, 1, 2 \ldots)$$

wherein L represents the overall length of the horn, C represents the velocity of sound in the air and n is a positive integer including zero.

Accordingly, when n=0, the quarter wavelength and the horn length are substantially equal to each other enough to induce the resonance with the result that acoustically expanded sounds propagate from the mouth of the horn into the free atmosphere. At the frequency at which one-half wavelength is substantially equal to the horn length, however, sounds propagating from the front of the loudspeaker unit into the free atmosphere and sounds emanating from the rear of the loudspeaker unit which eventually propagate from the mouth of the horn in reverse phase relationship are matched in phase with each other because of a phase delay of one-half wavelength and are therefore mixed together to produce a reinforced increased level of the sound pressure. In view of this, even with the horn having a relatively small flaring constant, a high performance loudspeaker system capable of faithfully reproducing the low frequency range could have been accomplished.

With the prior art loudspeaker system described above, however, it has been found that, at the frequency at which one wavelength is equal to the horn length, the sounds propagating from the front of the loudspeaker unit and the sound emanating from the rear of the same loudspeaker which eventually propagate from the mouth of the horn have their phases opposite to each other enough to counteract with each other. In terms of a characteristic curve of the sound pressure versus frequency, this brings about an interference or reduced level of sound pressure.

Moreover, the cavity defined at the connection between the back of the loudspeaker unit and the horn throat, which cavity acts to attenuate medium-to-high frequency sounds which would propagate from the mouth of the horn, must have a relatively great volume in order for the medium-to-high frequency sounds to be completely attenuated and, in practice, with an increase in frequency, the horn tends to undergo the above described operation repeatedly to such an extent as to result in creation of reinforced and interference portions in sound pressure of composite sounds formed by the sound propagating from the front of the loudspeaker unit and those from the mouth of the horn. This brings about reduction in quality of the sounds reproduced from the loudspeaker system as a whole.

SUMMARY OF THE INVENTION

The present invention has been developed with a view towards substantially solving the above described problems and has for its essential object to provide an improved loudspeaker system having an improved acoustical radiation efficiency at the low frequency range and capable of providing a high quality sound having minimized distortion in sound pressure over a relatively wide range.

In accomplishing this and other objects, a loudspeaker system according to the present invention comprises a loudspeaker unit, a horn unit having a throat coupled to the back of the loudspeaker and an acoustic filter provided in the horn. The acoustic filter may be constituted by a throat or constricted area defined in the horn unit and having a cross-sectional area smaller than that of the horn unit, or by a shielding plate in the form of a draw cone made of a vibratory diaphragm that is supported by a suspension means within a substantially intermediate portion of the horn unit.

Preferably, the horn unit disposed behind the loudspeaker unit comprises a horn complex constituted by a plurality of horns having respective portions which are different in length from each other and which have a common mouth, the length of each of said portions being smaller than one half of the overall length of the horn unit. In this example, the acoustic filter is disposed within a common horn portion.

With the above described construction according to the present invention, assuming that the lowest frequency contained in the interference portion of the sound pressure occurring as a result of the phase delay because of the horn length is expressed by $f_d$, the provision of the acoustic filter which may be either the throat or constricted area having its cross-sectional area smaller than that of the horn or the drone cone inside the horn is effective in that a portion of the horn between the loudspeaker unit and the acoustic filter acts at the frequency fd as if it were a straight acoustic tube to produce a primary harmonic resonance. Because of this primary harmonic resonance, the sound pressure immediately preceding the acoustic filter is high enough to permit a sound pressure proportional to this sound pressure to be reproduced from the mouth of the horn. As compared with the sound produced from the front of the loudspeaker unit, the sound pressure propagating from the horn to the free atmosphere is high and the composite sound pressure of the loudspeaker system as a whole which is the difference between these sounds is of a level sufficient to compensate for the interference portion in the sound pressure produced by the prior art loudspeaker system. Moreover, because the acoustic filter provided according to the present invention has a reactance component, the acoustic filter concurrently acts as an acoustic high frequency cut-off filter effective to cut off the medium-to-high frequency range radiated from the mouth of the horn, and therefore, at this frequency range, the interference between the sound propagating from the front of the loudspeaker unit and the sound propagating from the mouth of the horn can be eliminated to accomplish the reproduction of a flat medium-to-high frequency range.

Furthermore, at the frequency at which the horn length is an odd-number multiple of the one-half wavelength, the sound emerging from the front of the loudspeaker unit and that from the mouth of the horn are matched in phase with each other and therefore reinforce each other, whereas at the frequency at which the horn length is an even-number multiple of the one-half wavelength, the phase relationship is reversed and, therefore, the sounds emerging from the front of the loudspeaker unit and that from the mouth of the horn interfere with each other. By this repetition, relatively large reinforcement and interference portions occur in the sound pressure characteristic. Therefore, if an arrangement is made such that, at the frequency at which the horn length of one of the horns is equal to an odd-number multiple of the one-half wavelength, the horn length of another one of the horns is limited to an even-number multiple of the one-half wavelength and that the horns are coupled to the common mouth to complete the horn complex while the acoustic filter is disposed in the common horn portion, reinforcement portions and interference portions produced in the respective sound pressures propagating in these horns can be counteracted and, in combination with the cumulative effects of the acoustic filter, the sound pressure characteristic can be rendered very flat as compared with that in the prior art loudspeaker system. Therefore, with the present invention, it is possible to provide a loudspeaker system having no substantial reduction in quality of the reproduced sounds.

BRIEF DESCRIPTION OF THE DRAWINGS

The above and other objects and features of the present invention will become apparent from the following description taken in conjunction with preferred embodiments thereof with reference to the accompanying drawings in which like parts are designated by like reference numerals and in which.

DETAILED DESCRIPTION OF THE PREFERRED EMBODIMENTS

Figure 1:
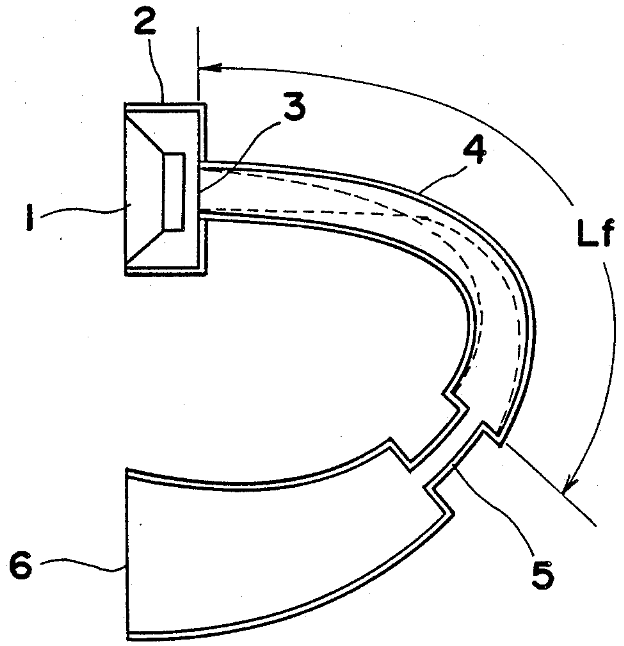
FIG. 1 is a schematic sectional view of a loudspeaker system according to one preferred embodiment of the present invention.

Referring first to FIG. 1, a loudspeaker system shown therein comprises a cabinet 2 of generally box-like configuration, a loudspeaker unit 1 fixedly installed within the cabinet 2, and a horn 4 having a throat 3, communicated with an opening defined in a rear wall of the cabinet 2, and also having a mouth 6 opposite to the throat 3. The horn 4 has an acoustic filter 5 formed therein and constituted by a throat or constricted area having a cross-sectional area smaller than that of the horn 4 and positioned intermediate between the throat 3 and the mouth 6.

The loudspeaker system so constructed as shown in FIG. 1 operates in the following manner.

Sounds emerging from the rear of the loudspeaker unit 1 are guided into the horn 4 through the throat 3 coupled to the cabinet 2 and subsequently pass through an empty space between the throat and mouth through the acoustic filter 5, represented by the constricted area, before they are propagated to the free atmosphere through the mouth 6 of the horn 4. A sound pressure radiated from the loudspeaker system as a whole is a composite of the sound propagating from the front of the loudspeaker unit 1 and the sound propagating from the mouth 6 of the horn 4. The length Lf of an upstream portion of the horn 4 from the throat 3 to the acoustic filter 5 is so selected as to be generally equal to one half of the wavelength of the first frequency $f_d$ of the low frequency range in the cyclic interference portions of sound pressure which occur as a result of the opposite phase relationship between the sound from the front of the loudspeaker unit 1 and that from the mouth 6 of the horn 6. The acoustic filter 5 so disposed as hereinabove described is effective to render the acoustical impedance of the horn 4 to be discontinuous and acts as if it were an acoustic tube having its opposite ends closed by the loudspeaker unit 1 and the acoustic filter 5. Broken lines depicted within the horn 4 in FIG. 1 represent a pattern of sound pressure distribution of standing waves which are produced when the acoustic filter 5 has acted as if it were an acoustic tube having its opposite ends closed by the loudspeaker unit 1 and the acoustic filter 5, thereby producing the primary harmonic resonance within the horn 4. In the sound pressure distribution pattern, a node occurs at an intermediate point while loops occur at opposite ends, and a relatively great sound pressure occurs at the entrance to the acoustic filter 5. Accordingly, within the interior of a downstream portion of the horn 4 between the acoustic filter 5 and the mouth of the horn 4, the horn operates in a manner similar to the horn in the conventional loudspeaker system with a new source of sound constituted at the entrance to the acoustic filter 5, thereby producing from the mouth 6 of the horn a sound pressure proportional to the great sound pressure of standing waves. In other words, the downstream portion of the horn 4 acts in a manner similar to the horn used in the prior art loudspeaker system as if a source of sound were to be positioned at the entrance to the acoustic filter 5, thereby to produce from the mouth 6 of the horn 4 acoustical sounds of a magnitude proportional to the magnitude of the standing waves within the upstream portion of the horn 4.

Figure 2:
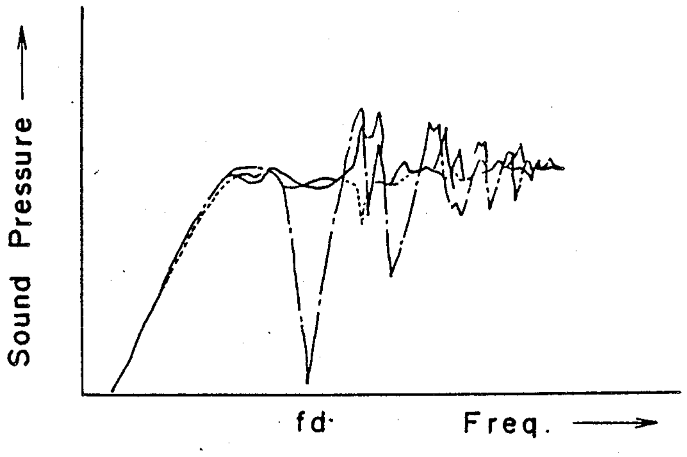
FIG. 2 is a graph showing the sound pressure versus frequency characteristic of the loudspeaker system shown in FIG. 1 and also that according to a second preferred embodiment of the present invention.

Since the position of the acoustic filter 5 is so selected as to be about equal to one half of the wavelength at the frequency $f_d$, the primary harmonic resonance of the close-ended straight acoustic tube occurs between the loudspeaker unit 1 and the acoustic filter 5. Because of this, at a frequency range in the vicinity of the frequency $f_d$, the sound pressure radiated from the mouth 6 of the horn will become very great, and the difference between the sound propagating from the front of the loudspeaker unit 1 and that from the horn is of a level sufficient to compensate for the relatively large interference portion produced in the sound pressure according to the prior art system. The sound pressure versus frequency characteristic of the loudspeaker system according to the embodiment shown in FIG. 1 is shown by a solid line in the graph of FIG. 2 whereas that of the prior art loudspeaker system is shown by a single-dotted chain line. From the graph of FIG. 2, it is clear that, at the frequency $f_d$ at which, according to the prior art loudspeaker system, the relatively large interference portion is produced, the sound pressure characteristic of the loudspeaker system according to the present invention is considerably improved. It is also clear that, at a lower frequency range than the frequency $f_d$, since the wavelength is prolonged, no standing wave is produced between the loudspeaker unit 1 and the acoustic filter 5 and the loudspeaker system of the present invention can work in a manner substantially identical with the prior art loudspeaker system. Yet, at a frequency range higher than the frequency $f_d$, since the constricted area or throat forming the acoustic filter 5 can be regarded as an acoustical mass similar to a port in a bass chamber, the reactance component increases with an increase in the frequency enough to cut off a component of the intermediate-to-high frequency range then passing through the acoustic filter 5, thereby considerably attenuating the level of the sound pressure radiated from the mouth 6 of the horn while acting as an acoustic high frequency cut-off filter. As a result thereof, the sound pressure within the medium-to-high frequency range produced by the loudspeaker system is transformed into sounds substantially radiated from the front of the loudspeaker unit 1, and the reinforcement and interference portions in the sound pressure which are formed by the interference between the sounds radiating from the front of the loudspeaker unit 1 and the mouth 6 of the horn can be minimized.

Figure 3:
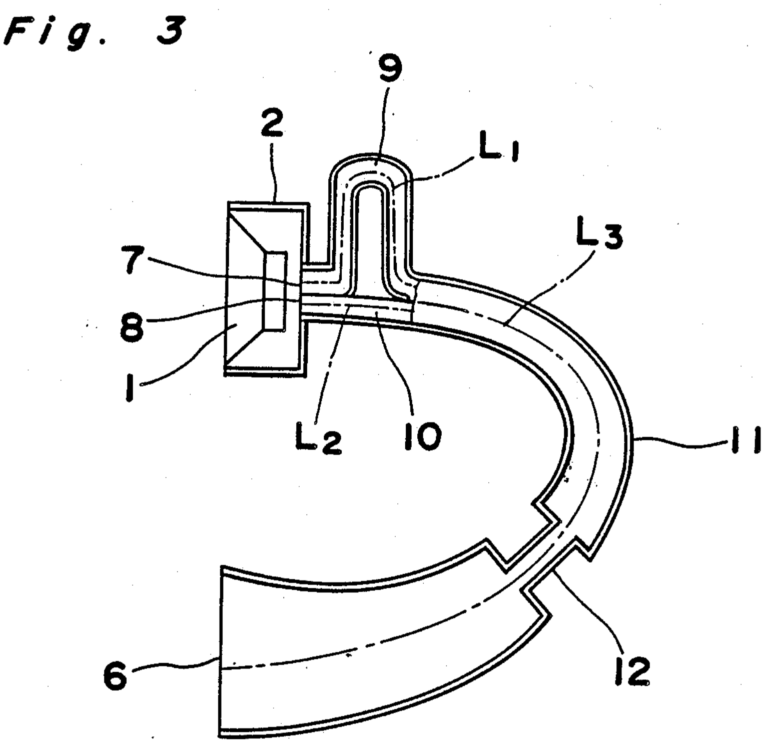
FIG. 3 is a schematic sectional view of the loudspeaker system according to the second preferred embodiment of the present invention.

The loudspeaker system according to a second preferred embodiment of the present invention is illustrated in FIG. 3. The loudspeaker system shown in FIG. 3 is a variation of the loudspeaker system of FIG. 1 in which a portion of the throat of the horn 4 is divided into a plurality of sections of different lengths. The horn unit shown in FIG. 3 may be termed a composite horn and is comprised of two horn sections 9 and 10 of different lengths having their respective throats 7 and 8 communicated to the cabinet 2 behind the loudspeaker unit 1, respective openings of said horn sections 9 and 10 opposite to the throats 7 and 8 being communicated with a common horn section 11. The common horn section 11 has a constricted area or throat defined therein so as to constitute an acoustic filter 12 similar to the acoustic filter 5 shown in FIG. 1.

Figure 4:
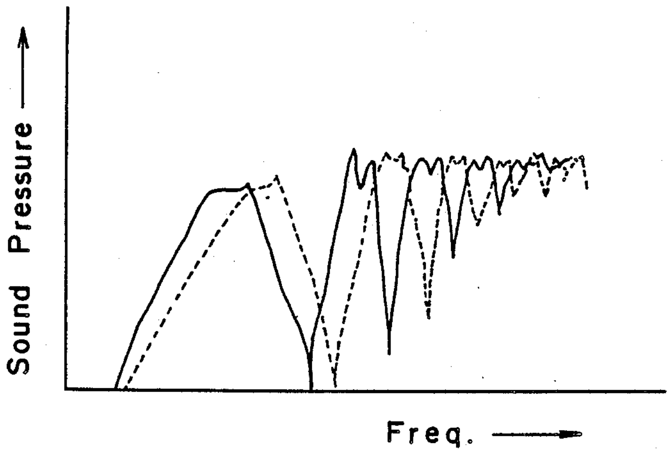
FIG. 4 is a graph showing the sound pressure versus frequency characteristic used to explain the operation of the loudspeaker system according to the second embodiment of the present invention.

The loudspeaker system according to the second embodiment of the present invention shown in and described with reference to FIG. 3 operates in the following manner. Assuming that the respective lengths of the horn sections 9 and 10 are expressed by L1 and L2 and the length of the common horn section 11 is expressed by L3, the operation of the horn unit at the medium-to-high frequency range at which the wavelength is relatively short can be considered as that of a composite of horns one having a length of L1+L3 and the other having a length of L2+L3. FIG. 4 illustrates sound pressure versus frequency characteristics of the respective horns of L1+L3 and L2+L3 in length, respectively, with no acoustic filter used in the horn unit. The graph of FIG. 4 makes it clear that, in the back-loaded horn system, the frequency at which the reinforcement and interference portions are produced in the sound pressure is dependent on the horn length, and therefore, by the utilization of this characteristic, the sound pressure characteristic at the medium-to-high frequency range can be rendered flat.

At the frequency at which the horn length is generally equal to an odd-number multiple of the one-half wavelength, the sounds radiated from the front of the loudspeaker unit and that from the mouth of the horn unit are matched in phase with each other while, at the frequency at which the horn length is generally equal to an evennumber multiple of the one-half wavelength, both sounds are opposite in phase to each other. In view of the fact that the repetition of this brings about the relatively large hills and dales in the sound pressure characteristic, it is recommended that the respective horn lengths of the horn sections be so selected that, at the frequency at which the horn length of one horn section is equal to an odd number multiple of the one-half wavelength, the horn length of the other horn section becomes equal to an even-number multiple of the one-half wavelength, and vice versa. Accordingly, if an arrangement is made such that the frequency at which the length of the shorter horn section (i.e., L2+L3) is an odd-number multiple of the one-half wavelength is matched with the frequency at which the length of the longer horn section (i.e., L1+L3) is an even-number multiple of the one-half wavelength, the following relationships can be established.

$$(C\times 2)/2(L1+L3)=C/2(L2+L3) \qquad (1)$$

Therefore, $(L1+L3)/(L2+L3)=2$ $$(C\times 4)/2(L1+L3)=(C\times 3)/2(L2+L3) \qquad (2)$$

Therefore, $(L1+L2)/(L2+L3)\approx 1.3$ $$(C\times 6)/2(L1+L3)=(C\times 5)/2(L2+L3) \qquad (3)$$

Therefore, $(L1+L2)/(L2+L3)\approx 1.2$ $$(C\times 8)/2(L1+L3)=(C\times 7)/2(L2+L3) \qquad (4)$$

Therefore, $(L1+L2)/(L2+L3)\approx 1.1$

Thus, depending on the frequency at which the reinforcement and interference portions of the sound pressure are matched with each other, the ratio of (L1+L3)/(L2+L3) varies. However, since the reinforcement and interference portions of the sound pressure are not so steep and have a certain bandwidth, it is possible to make the reinforcement and reinforcement portions of the sound pressure match with each other particularly at the medium-to-high frequency range if the ratio of (L1+L3)/(L2+L3) is within the range of 1.1 to 2. In view of this, in the embodiment shown in FIG. 3, since if the ratio of the horn lengths (L1+L3) and (L2+L3) is selected to be 1.2 the hills and dales of the sound pressures produced by the respective horn sections can be counteracted, the composite sound pressure of these horn sections at the medium-to-high frequency range can be rendered very flat. However, the frequency range in which the first interference portion of the sound pressure within a low frequency range which results from the reverse phase relationship between the sounds radiated respectively from the front of the loudspeaker unit and the mouth of the horn is very large and, therefore, the above described parallel horns cannot be effective to substantially eliminate the problem. Therefore, as is the case with the first embodiment of the present invention shown in and described with reference to FIG. 1, the acoustic filter is provided to substantially eliminate the occurrence of the interference portions in the sound pressure. The sound pressure versus frequency characteristic of the loudspeaker system according to this second embodiment of the present invention shown in and described with reference to FIG. 4 is shown by a broken line in the graph of FIG. 2. The graph of FIG. 2 also makes it clear that, by the cumulative effects of the acoustic filter acting as a high frequency cut-off filter and the effect of counteracting the reinforcement and interference portions of the sound pressure occurring in the parallel horns, a more flat sound pressure characteristic than that exhibited by the first embodiment of the present invention can be attained at the medium-to-high frequency range.

Figure 5:
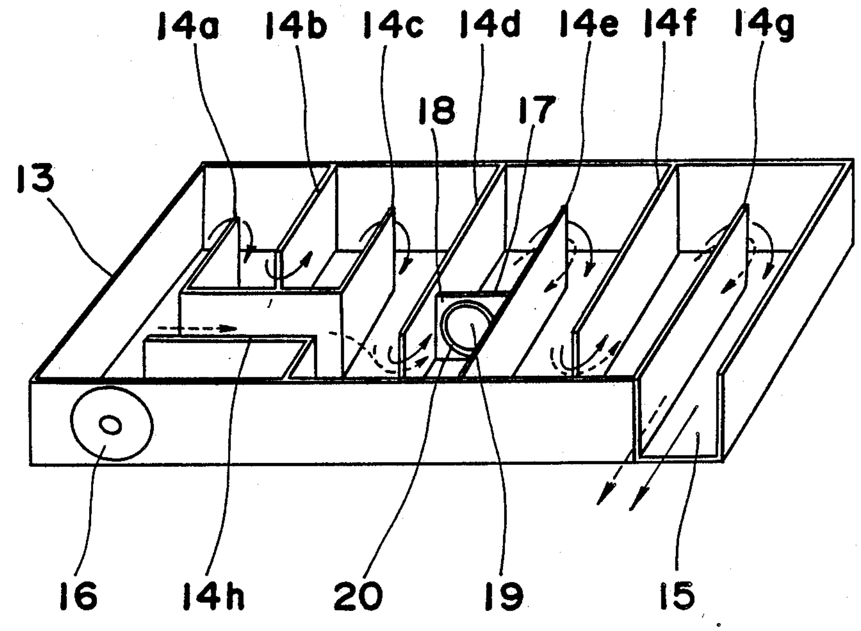
FIG. 5 is a schematic perspective view of the loudspeaker system according to a third preferred embodiment of the present invention.

FIG. 5 illustrates a loudspeaker system according to a third preferred embodiment of the present invention in a perspective representation with a portion cut away. Referring now to FIG. 5, the loudspeaker system shown therein comprises a cabinet 13 of generally rectangular box-like configuration having a plurality of partition plates 14*a* to 14*h* so disposed and so positioned within the interior of the cabinet 13 as to form two acoustic tubes of different lengths adjacent a loudspeaker unit 16 and one common acoustic tube communicated at one end with the shorter and longer acoustic tubes and at the opposite end 15 opening to the free atmosphere. The other end of the common acoustic tube, delimited within the cabinet 13 by the partition plates 14*d* to 14*g*, remote from the opening 15 is provided with an acoustic filter 17 that is in the form of a drone cone constituted by a shielding plate 18, a vibratory diaphragm 19 and a suspension 20. Arrow-headed broken lines employed in FIG. 5 represent the passage of sounds through the shorter acoustic tube whereas arrow-headed solid lines employed therein represent the passage of sounds through the longer acoustic tube.

Even though the acoustic filter 17 is constituted by the drone cone 19 supported through the suspension 20 by the shielding plate 18 capable of acoustically shielding the interior of the horn as shown in FIG. 5, the acoustical impedance within the interior of the horn can be rendered discontinuous, and in the vicinity of the frequency at which the length between the horn throat and the drone cone is equal to the one-half of the wavelength, it can work in a manner similar to the close-end straight acoustic tube thereby to exhibiting effects similar to those exhibited by the loudspeaker system shown in and described with reference to FIG. 1.

Also, in the foregoing embodiments of the present invention, the position of the acoustic filter is so selected as to be spaced from the loudspeaker unit a distance corresponding to about one half of the wavelength at the frequency $f_d$. However, depending on the volume of the space behind the loudspeaker unit and/or the ratio between the size of a vibrating diaphragm of the loudspeaker unit and the size of the horn throat, the position of the acoustic filter may require adjustment. In such case, if the position of the acoustic filter is adjusted to the position where the primary harmonic resonance can be obtained between the loudspeaker unit 1 and the acoustic filter in a manner similar to that in the close-end straight acoustic tube thereby to make the frequency of this resonance substantially equal to the frequency fd, effects similar to those exhibited by this embodiment can be obtained.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A loudspeaker system comprising:

a loudspeaker unit having means for radiating a first sound from a front thereof;

a horn unit having a throat coupled to a back of the loudspeaker unit for radiating a second sound; and an acoustic filter in said horn for causing an acoustic impedance of the horn unit to be discontinuous, said horn unit having a length from said throat to said acoustic filter for causing said length of said horn to produce a primary harmonic resonance at a frequency $f_d$, said frequency $f_d$ being a frequency equal to a minimum frequency in an interference portion of a combined sound made up of said first sound and said second sound after said second sound has passed through said horn and radiated outwardly from the mouth of the horn, which harmonic resonance is similar to that produced by a straight acoustic tube having opposite ends thereof closed.

2. The loudspeaker system as claimed in claim 1 in which the length of said horn unit from said throat to said acoustic filter is substantially equal to one half of a wavelength of the frequency $f_d$.

3. The loudspeaker system as claimed in claim 1 in which said horn unit has a portion adjacent said throat which is comprised of a plurality of horn sections of different lengths.

4. The loudspeaker system as claimed in claim 3 in which said acoustic filter is disposed within an opposite portion of said horn unit.

5. The loudspeaker system as claimed in claim 3 in which said horn unit has a common horn section connecting said plurality of horn sections and said acoustic filter and into which said horn section opens.

6. The loudspeaker system as claimed in claim 5 in which the lengths of the respective horn sections are L1 and L2 and a length of said common horn section is L3, and a ratio of (L1+L3)/(L2+L3) is in a range of 1.1 to 2.

7. The loudspeaker system as claimed in claim 6 in which a sum of L1+L2 equals an odd number multiple of one-half a wavelength of the frequency $f_d$ and a sum of L2+L3 equals an even number multiple of the one-half wavelength at the frequency $f_d$.

8. The loudspeaker system as claimed in claim 3 in which said horn unit has a further horn section between said acoustic filter and the mouth of said horn unit.

9. The loudspeaker system as claimed in claim 3 in which said horn unit comprises a cabinet having a plurality of partition plates in an interior thereof positioned to define acoustic tubes constituting said horn sections and a remainder of said horn unit other than said horn sections.

10. The loudspeaker system as claimed in claim 1 in which said acoustic filter is constituted by a throat having a cross-sectional area smaller than a cross-sectional area of said horn unit.

11. The loudspeaker system as claimed in claim 1 in which said acoustic filter comprises a shielding plate for acoustically shielding an interior of said horn unit and which plate has a center, and a vibratory diaphragm and a suspension supporting said vibratory diaphragm in the center of said shielding plate.

12. The loudspeaker system as claimed in claim 1 in which said horn unit comprises a cabinet and at least one partition plate within said cabinet positioned to form an acoustic tube, said acoustic filter being positioned within said acoustic tube.

* * * * *